(12) United States Patent
Nakanishi et al.

(10) Patent No.: US 6,396,157 B2
(45) Date of Patent: May 28, 2002

(54) SEMICONDUCTOR INTEGRATED CIRCUIT DEVICE AND MANUFACTURING METHOD THEREOF

(75) Inventors: Hiroyuki Nakanishi, Kitakasuragi-gun; Katsunobu Mori, Nara; Toshiya Ishio, Nabari; Shinji Suminoe, Tenri, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/752,682

(22) Filed: Jan. 3, 2001

(30) Foreign Application Priority Data

Feb. 28, 2000 (JP) ........................................ 2000-052405

(51) Int. Cl.⁷ .......................... H01L 23/48; H01L 23/52
(52) U.S. Cl. ..................... 257/781; 257/784; 257/750; 257/758; 257/693
(58) Field of Search ............................... 257/781, 693, 257/737, 738, 750, 758, 784; 438/614, 617

(56) References Cited

U.S. PATENT DOCUMENTS

| | | | | |
|---|---|---|---|---|
| 3,461,357 A | * | 8/1969 | Mutter et al. | 257/737 |
| 4,182,781 A | * | 1/1980 | Hooper et al. | 427/90 |
| 5,866,949 A | * | 2/1999 | Schueller et al. | 257/778 |
| 5,925,931 A | * | 7/1999 | Yamamoto | 257/737 |
| 5,960,308 A | * | 9/1999 | Akagawa et al. | 438/613 |
| 5,969,424 A | * | 10/1999 | Matsuki et al. | 257/768 |
| 6,020,561 A | * | 2/2000 | Oshida et al. | 257/737 |
| 6,054,773 A | * | 4/2000 | Ohsawa et al. | 257/783 |
| 6,097,087 A | * | 8/2000 | Farnworth et al. | 257/698 |
| 6,111,317 A | * | 8/2000 | Okada et al. | 257/737 |
| 6,121,688 A | * | 9/2000 | Akagawa | 257/778 |
| 6,153,448 A | * | 11/2000 | Takahashi et al. | 438/114 |
| 6,159,837 A | * | 12/2000 | Yanaji et al. | 438/613 |

FOREIGN PATENT DOCUMENTS

| | | | | |
|---|---|---|---|---|
| JP | 53-68970 | * | 6/1978 | 257/737 |
| JP | 8-264932 A | | 10/1996 | |

OTHER PUBLICATIONS

Asakura et al, "Chip–Size Assembly Will Change Semiconductor Manufacturing (Part I and II of Special Report)", Nikkei Microdevices, Aug. 1998, pp. 42–59.

* cited by examiner

Primary Examiner—Jhihan B Clark
(74) Attorney, Agent, or Firm—Nixon & Vanderhye, P.C.

(57) ABSTRACT

A semiconductor integrated circuit device in accordance with the present invention is provided with first electrode pads, a first insulation layer and a second insulation layer. The first electrode pad are formed on the circuit formation face side of an IC chip. The first insulation layer is placed on areas other than the upper portions of the first electrode pads. The second insulation layer, which is made from a photosensitive material, is formed on the first insulation layer with an opening section for allowing at least one portion of the first electrode, the wire and at least one portion of the second electrode to be exposed. Here, the wire and the second electrode are formed by filling the opening section of the second insulation layer with particles of a conductive material. Thus, it is possible to provide a semiconductor integrated circuit device to which a fine wire processing technique is applied while maintaining the same functions as conventional devices at low costs, and a manufacturing method for such a device.

6 Claims, 8 Drawing Sheets

FIG. 8(a) *(Prior Art)*
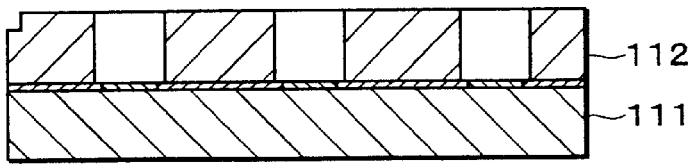
FIG. 8(b) *(Prior Art)*
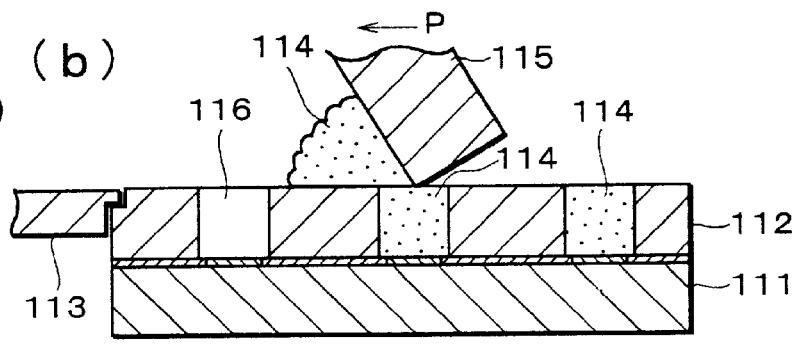
FIG. 8(c) *(Prior Art)*
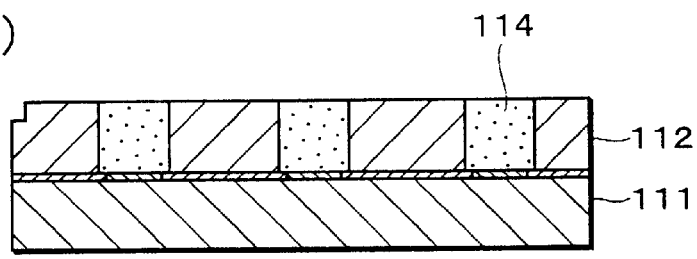
FIG. 8(d) *(Prior Art)*
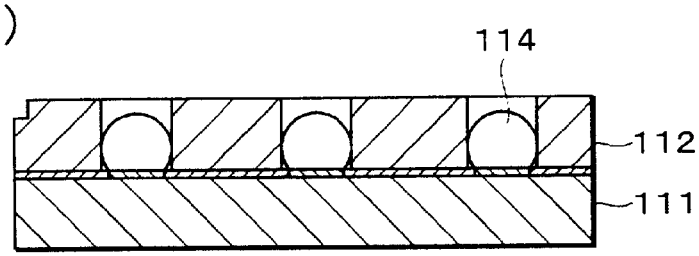
FIG. 8(e) *(Prior Art)*
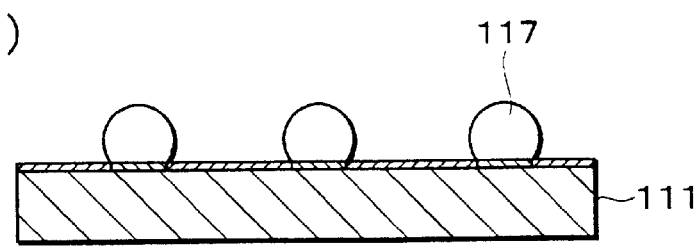

SEMICONDUCTOR INTEGRATED CIRCUIT DEVICE AND MANUFACTURING METHOD THEREOF

FIELD OF THE INVENTION

The present invention relates to a semiconductor integrated circuit device which is assembled and installed in an electronic apparatus, and also concerns a manufacturing method of such a device.

BACKGROUND OF THE INVENTION

Conventionally, with respect to semiconductor integrated circuit devices including semiconductor integrated circuit chips (hereinafter, referred to as IC chips), various external shapes have been proposed from the viewpoints of functions, purposes of use and assembling properties onto printed substrates of IC chips.

In recent years, particularly, in the field of small-size portable apparatuses, there has been an ever-increasing demand for further miniaturized semiconductor integrated circuit devices so as to satisfy the need of high-density assembling properties of electronic parts installed therein. Such miniaturized semiconductor integrated circuit devices are referred to as CSP (Chip Size Package or Chip Scale Package). With respect to externally connecting terminals of the CSP, solder balls, arranged in a matrix format, have been generally used.

FIG. 6(a) is a plan view that shows a structural example of a conventional semiconductor integrated circuit. FIG. 6(b) is a cross-sectional view taken along D—D of FIG. 6(a). This semiconductor integrated circuit device 101 is constituted by an IC chip 102, a plurality of first electrode pads 103, a first insulating layer 104, a plurality of wires (redistribution) 105, a plurality of second electrode pads 106, a second insulation layer 107 and a plurality of externally connecting terminals 108.

A plurality of electrode pads 103 are formed on the surface of the IC chip 2. The first insulation layer 104 is stacked on the IC chip 102 in such a manner that at least one portion of each of the electrode pads 103 is exposed. The wires (redistribution) 105 are placed so as to allow the first electrode pads 103 to be electrically connected to the respective second electrode pads 106. The second insulation layer 107 is stacked on the IC chip 102 with at least one portion of the second electrode pads 106 being exposed. The externally connecting terminals 108 are formed by solder balls and placed on the respective second electrode pads 106.

The semiconductor integrated circuit device 101 having the above-mentioned structure, together with other semiconductor integrated circuit devices (CSP), has been proposed in featuring articles Part 1 and Part 2 (pages 42 to 59) of "Nikkei Microdevice 1998-8 (August 1 issue)" published by Nikkei BP Ltd.

In accordance with this article, in the formation method of the portion corresponding to the wires 105, first, a polymer passivation film (corresponding to the first insulation layer 104) is formed, and wires are formed on this film. FIGS. 7(a) through 7(e) are drawings that show processes in which the portion of the above-mentioned wires 105 is formed by using the above-mentioned generally-used method. Here, in this state, the semiconductor integrated circuit devices 101 are formed on a wafer, and have not been divided into individual semiconductor integrated circuits.

First, a wiring base metal 109, which forms a base layer of the wires 105, is formed on the entire surface (the entire surface of the IC chip 102) of a wafer by sputtering (see FIG. 7(a)). Next, photoresist 110 is applied onto this layer (see FIG. 7(b)), and this is subjected to exposure and development so that the photoresist 110 placed on the formation area of the wiring 105 is removed (see FIG. 7(c)). Moreover, wires 105 are formed on portions from which the photoresist 110 has been removed, by plating, etc. (see FIG. 7(d)). After formation of the wires 105, all the photoresist 110 is removed, the wiring base metal 109 located between the wires 105 is etched by chemical, etc., and the second insulation layer 107 and the externally connecting terminal 108 are then formed (see FIG. 7(e)). Through these processes, the respective wires 105 are formed as an electrically isolated pattern.

Moreover, in addition to the above-mentioned formation method, another method has been proposed in which conductive paste is simply printed by using a mask formed by etching a steel plate or a meshed screen mask so as to form wires.

However, in the above-mentioned method, in an attempt to form wires (redistribution) 105 inside the conventional semiconductor circuit device by using a method having the same basic principle as a technique referred to as a photolithography method for forming fine circuits of an IC chip, the following seven processes are required.

(1) Process for forming the wiring base metal by sputtering
(2) Application of photoresist
(3) Process for exposing the photoresist
(4) Process for developing the photoresist
(5) Process for plating wiring (redistribution) material
(6) Process for removing the photoresist
(7) Process for etching the wiring (redistribution) base metal In the above-mentioned conventional method, the above-mentioned many (seven) processes are required because of the structure in which the wires 105 are distributed on the insulation layer 104. Each of these processes requires an exclusively-used device; therefore, if there is any process that can be omitted from the above-mentioned seven processes or if there is another process that can replace any of the processes so as to reduce the production cost, without causing degradation in the functions of the wires 105, the above-mentioned seven processes will cause extra costs that would be reduced by such a process to be omitted or to be replaced with.

On the other hand, in the case when the wires 105 are formed by simply printing conductive paste by using a mask formed by etching a steel plate or a meshed screen mask, the following problems arise.

(1) A problem in which after removing the mask, the conductive paste tends to spread in the horizontal direction.

(2) A problem in which, taking into consideration the present mask processing technique (with respect to masks formed by etching steel plates, meshed screen masks, etc.), it is difficult to form wires not more than 50 $\mu$m in a stable manner (without contact between the adjacent wires, without discontinuity in the wires).

In the semiconductor integrated circuit device 101, a plurality of the wires 105 are arranged so as to pass between the externally connecting terminals 108; therefore, it is not possible to narrow the distance between the externally connecting terminals 108 without the fine processing. Consequently, in the case when such a method is used, it is inevitable to design the semiconductor integrated circuit device 101 to have a large size.

Japanese Laid-Open Patent Application No. 264932/1996 "Tokukaihei 8-264932 (published on Oct. 11, 1996)" has disclosed a formation method of solder bumps in which, at the time of forming solder bumps, solder is not transferred so that it is possible to prevent degradation in forming the solder balls (see FIGS. 8(a) through 8(e)).

In other words, in accordance with the method disclosed in the above-mentioned patent publication, prior to the printing process, a spacers 112 is placed on a printed wiring board 111, and then affixed thereon (see FIG. 8(a)) Further, the metal mask 113 is fitted to spacer 112 (see FIG. 8(b)). Then, paste 114 is put on the metal mask 113, and the solder paste 114 is filled in opening sections 116, and printed therein (see FIG. 8(b)), by using a normal screen printing method while a stage 115 being shifted from right to left as shown by arrow P (see FIG. 8(b)). Next, the metal mask 113 is removed from the spacer 112, and heated by using a reflow device (see FIG. 8(c)). Then, the solder paste 114 is allowed to form a spherical shape through surface tension (see FIG. 8(d)). In this state, this is cooled and the spacer 112 is removed from the printed wiring board 111 so that solder bumps 117 are formed on the printed wiring board 111.

The application of the above-mentioned method makes it possible to prevent solid components in flux in the solder paste from contacting during the reflow process, thereby reducing the area of wiring pads. Therefore, even when much solder paste is used, it is possible to prevent degradation in the formation of the solder bumps due to transfer of paste.

However, the technique, disclosed by the above-mentioned Patent Publication, is exclusively used for the formation of solder bumps, and if this was applied to the formation of wires (redistribution), a spacer having a thickness of not more than 10 µm would be required. As in the case of the above-mentioned problem (2), it is extremely difficult to form such a thin spacer. Therefore, since the technique of the above-mentioned Patent Publication is related to a formation method of solder balls, it would raise various problems to apply this method, as it is, as the formation of wires.

SUMMARY OF THE INVENTION

An objective of the present invention is to provide a semiconductor integrated circuit device to which a fine wire processing technique is applied while maintaining the same functions as conventional devices at low costs, and a manufacturing method for such a device.

In order to achieve the above-mentioned objective, the semiconductor integrated circuit device of the present invention is provided with: a semiconductor integrated circuit chip; a first electrode formed on the circuit formation face side of the semiconductor integrated circuit chip; a first insulation layer which is stacked on the circuit formation face of the semiconductor integrated circuit chip so as to allow at least one portion on the first electrode to be exposed through an opening section; a second electrode used for external connection; a wire placed on the first insulation layer with one end being connected to the first electrode through the opening section of the first insulation layer and the other end being connected to the electrode, and a second insulation layer which is made from a material having a photosensitive property, and placed on the first insulation layer, with an opening section for allowing at least one portion of the first electrode, the wire and at least one portion of the second electrode to be exposed, and is characterized in that the wire and the second electrode are formed by filling the opening section of the second insulation layer with particles of a conductive material.

With the above-mentioned arrangement, the second insulation layer has the opening section through which the particles of the conductive material are filled at the time of formation of the wire and the second electrode, thereby serving as a mask at the time of the formation of the wire and the second electrode. The second insulation layer, which functions as a mask in this manner, serves as an insulation film for preventing the adjacent wires from contacting each other, after completion of the device; therefore, different from a mask used in a generally-used printing method, it is not necessary to remove the second insulation film is even after the filling process of the conductive particles. Moreover, since the second insulation layer is made from the material having a photosensitive property, it is allowed to function as photoresist at the time when, for example, a pattern is formed through a photolithography technique. Therefore, in the case when the pattern of the second insulation layer is formed by using the photolithography technique, it is possible to omit the process for providing photoresist in a separated manner.

In contrast, as shown as the conventional technique in the present specification, in the case of the semiconductor integrated circuit device in which the base layer wiring metal is formed by using the photolithography technique, and the wire and the second electrode are then formed through the plating process, many formation processes for the wire and the second electrode are required.

Moreover, as described above, in the present invention, it is not necessary to remove the second insulation layer after the particles of the conductive material have been filled. Therefore, different from the semiconductor integrated circuit device shown as the conventional technique in the specification, which is formed by using a method for simply applying conductive paste through a printing method, the arrangement of the present invention is free from a problem in which the conductive paste spreads in the horizontal direction after the mask has been removed. Moreover, the pattern of the second insulation layer, which functions as a mask in the present invention, is formed by using, for example, a photolithography technique that enable fine processing. Therefore, it is possible to obtain finer wires as compared with the device formed by using the conventional method.

As described above, the arrangement of the present invention makes it possible to provide a small-size semiconductor integrated circuit device which has fine wires and also provides the same functions as conventional devices at low costs.

Moreover, in order to achieve the above-mentioned objective, a manufacturing method of a semiconductor integrated circuit device in accordance with the present invention comprises: a first step of forming a first insulation layer which is formed on the circuit formation face of the semiconductor integrated circuit chip with an opening section through which at least one portion on the first electrode is exposed; a second step of forming an insulation film having a photosensitive property on the first insulation layer; a third step of forming a second insulation layer, with an opening section for allowing at least one portion of the first electrode, the wire connected to the first electrode and a formation area of the second electrode to be exposed, by exposing and developing the insulation film; and a fourth step of forming the wire and the second electrode by filling the opening section formed in the second insulation layer with particles of a conductive material.

In accordance with the above-mentioned method, since the material of the second insulation layer has a photosensitive property, the second insulation layer itself is allowed to function as photoresist. Therefore, upon patterning the second insulation layer by using a photolithography technique, it is possible to omit the process for providing photoresist in a separate manner. Consequently, the second electrode and the wire are formed through the following four processes: (1) a process for forming an insulation film used for the second insulation layer; (2) a process for exposing the insulation film; (3) a process for developing the insulation film; and (4) a process for filling a conductive material used for forming the second electrode and the wire.

In this manner, as compared with the semiconductor integrated circuit device in which the base layer wiring metal is formed by using the photolithography technique, and the wire portion is then formed through the plating process, as shown as the conventional technique in the present specification, it is possible to reduce the number of processes for forming the wire portion. Therefore, it becomes possible to manufacture a small-size semiconductor integrated circuit device at low costs.

Moreover, in the above-mentioned method, prior to forming the second electrode and the wire, the second insulation layer is preliminarily formed on the areas of the second electrode pad and the wire as well as on the area on the first electrode pad except for at least one portion. The second insulation layer functions as a mask at the time when the conductive material is filled. However, different from a mask used in a conventional printing method, since the second insulation layer is allowed to function as an insulating film for preventing contact between the adjacent wires after completion of the device, it is not necessary to remove it. Therefore, different from the semiconductor integrated circuit device shown as the conventional technique in the specification, which is formed by using a method for simply applying conductive paste through a printing method, the arrangement of the present invention is free from a problem in which the conductive paste spreads in the horizontal direction after the mask has been removed. Moreover, the pattern of the second insulation layer, which functions as a mask in the present invention, is formed by using a photolithography technique that enable fine processing. Consequently, it is possible to obtain finer wires as compared with the device formed by using the conventional method.

As described above, the application of the method of the present invention makes it possible to manufacture a small-size semiconductor integrated circuit device to which a fine wire processing technique is applied while maintaining the same functions as conventional devices at low costs.

For a fuller understanding of the nature and advantages of the invention, reference should be made to the ensuing detailed description taken in conjunction with the accompanying drawings.

BRIEF DESCRIPTION OF THE DRAWINGS

FIGS. 8(a) through 8(e) are drawings that show manufacturing processes of the conventional semiconductor integrated circuit device in accordance with a method different from the method shown in FIGS. 7(a) through 7(e).

DESCRIPTION OF THE EMBODIMENTS

[Embodiment 1]

Figure 1:
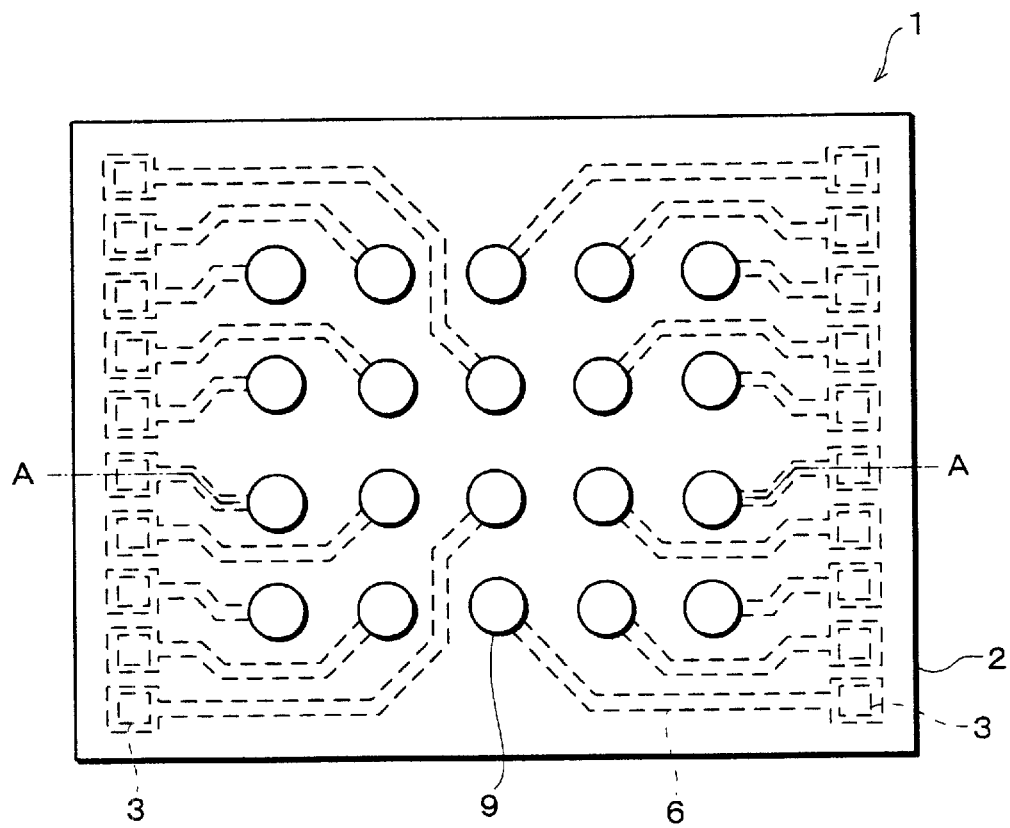
FIG. 1(a) is a plan view that shows a construction of a semiconductor integrated circuit device in accordance with one embodiment of the present invention.
FIG. 1(b) is a cross-sectional view taken along line A—A of FIG. 1(a).
Figure 1:
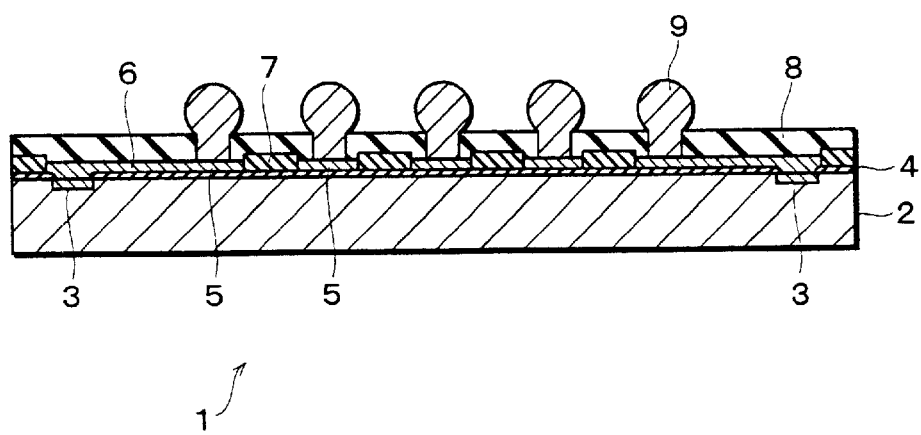

Referring to FIGS. 1(a), 1(b) through FIG. 5, the following description will discuss one embodiment of the present invention.

First, referring to FIGS. 1(a) and 1(b), an explanation will be given of a construction of a semiconductor integrated circuit device 1 in accordance with the present embodiment. FIG. 1(a) is a plan view that shows the construction of the semiconductor integrated circuit device 1, and FIG. 1(b) is a cross-sectional view taken along line A—A of FIG. 1(a).

The semiconductor integrated circuit device 1 in accordance with the present embodiment is constituted by an IC chip (semiconductor integrated circuit chip) 2, first electrode pads (first electrode) 3, a first insulation layer 4 stacked on the IC chip 2, an electrode pad (second electrode) 5 used for external connection, a plurality of wires (redistribution) 6, a second insulation layer 7, a third insulation layer 8 and an externally connecting terminal 9.

The first electrode pads 3 are formed on both of the ends of the surface of the IC chip 2. The first insulation layer 4 is stacked on the IC chip 2 with at least one portion of the first electrode pad 3 being exposed. The wires 6 are placed so as to electrically connect the first electrode pads 3 and the second electrode pads 5. The second insulation layer 7 is formed on areas other than the upper portions of the first electrode pads 3, the second electrode pads 5 and the wires 6. The third insulation layer 8 is formed on areas other than the upper portions of the second electrode pads 5. The externally connecting terminal 9 is formed on the second electrode pads 5.

Figure 2:
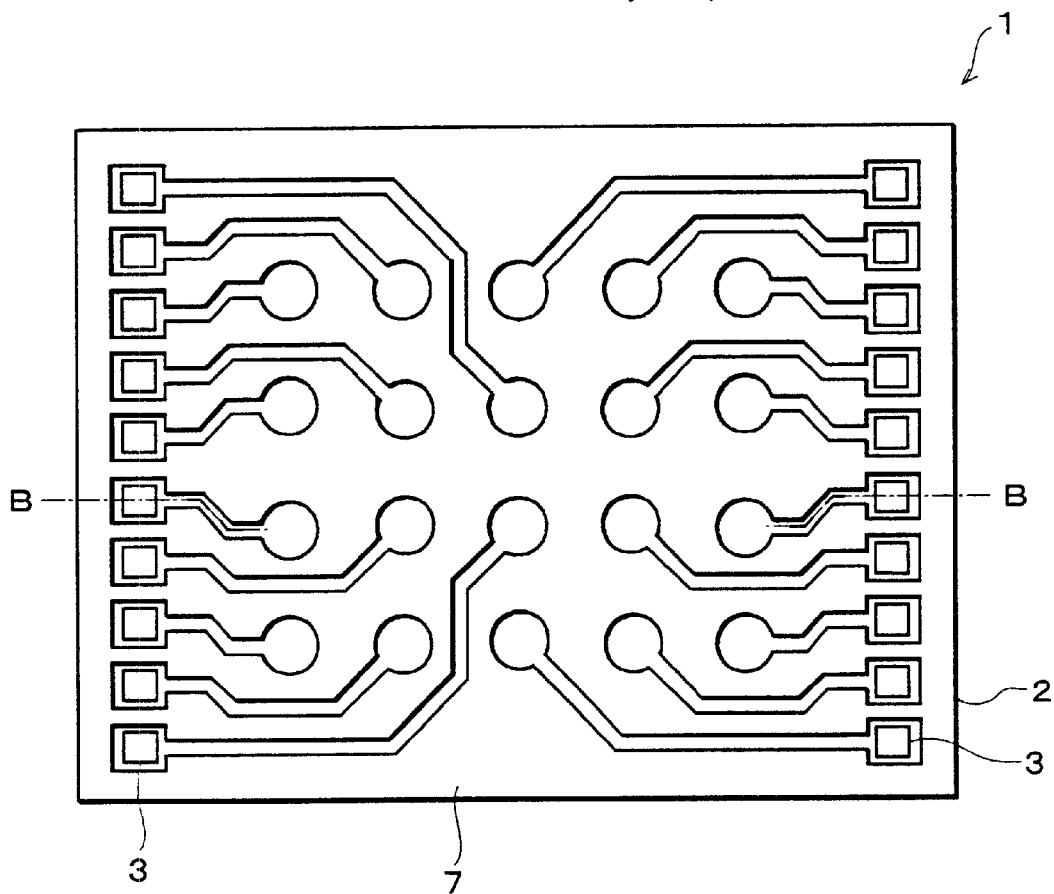
FIG. 2(a) is a plan view that shows a state in which the semiconductor integrated circuit device is being manufactured, as well as a state immediately before a conductor is formed.
FIG. 2(b) is a cross-sectional view taken along line B—B of FIG. 2(a).
Figure 2:
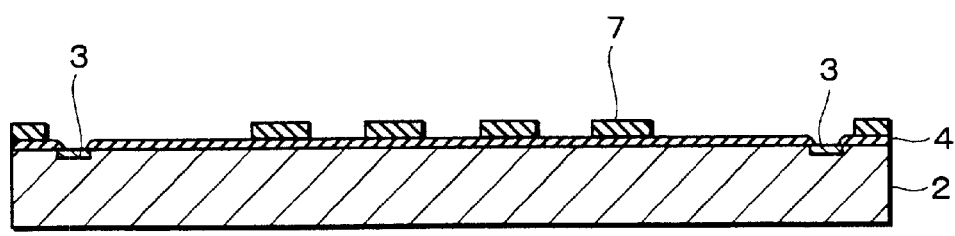
Figure 3:
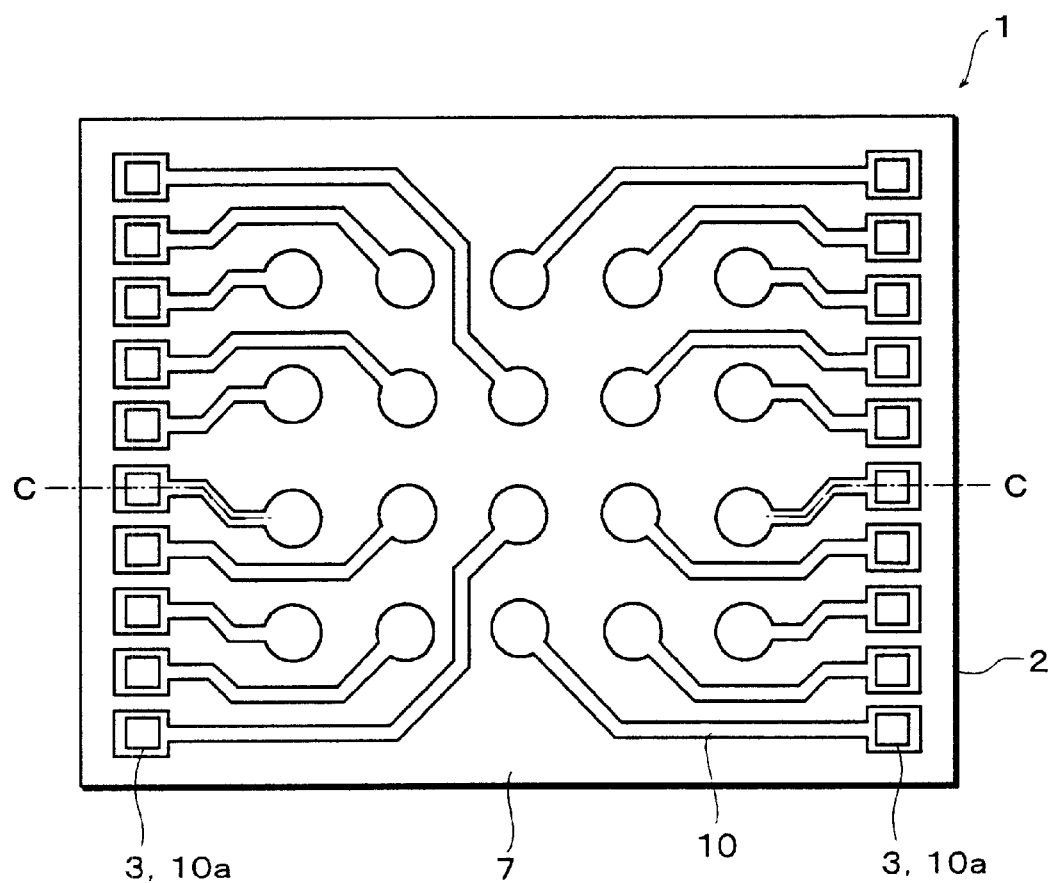
FIG. 3(a) is a plan view that shows a state in which the semiconductor integrated circuit device is being manufactured.
FIG. 3(b) is a cross-sectional view taken along line C—C of FIG. 3(a).
Figure 3:
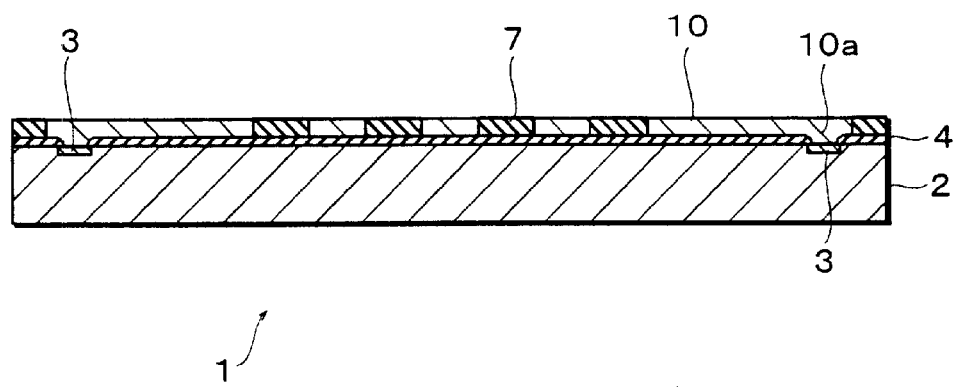
Figure 4:
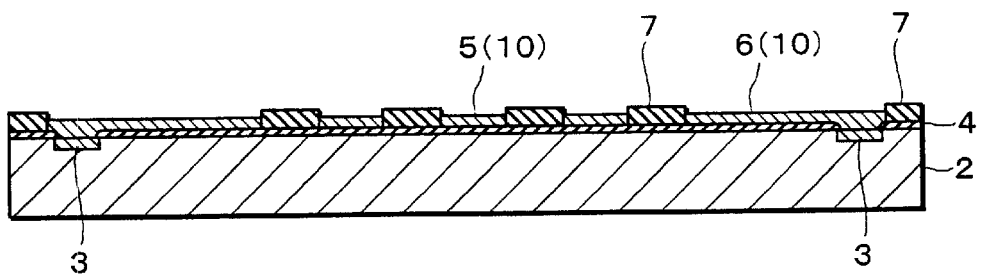
FIGS. 4(a) through 4(d) are drawings that show manufacturing processes of the semiconductor integrated circuit device.
Figure 4:
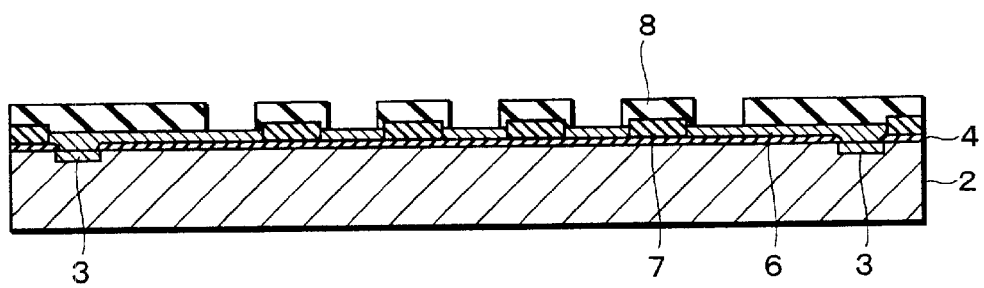
Figure 4:
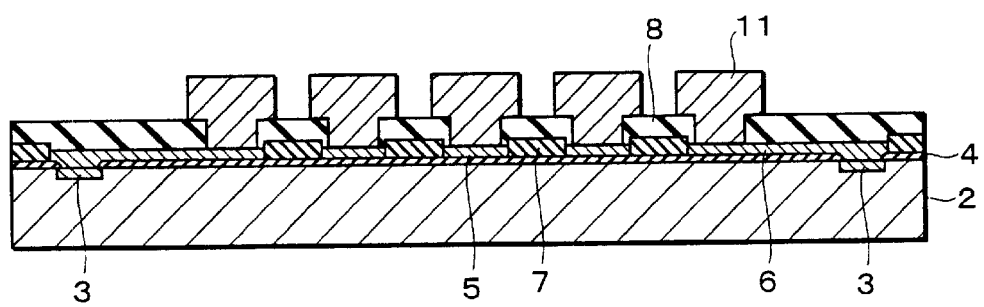
Figure 4:
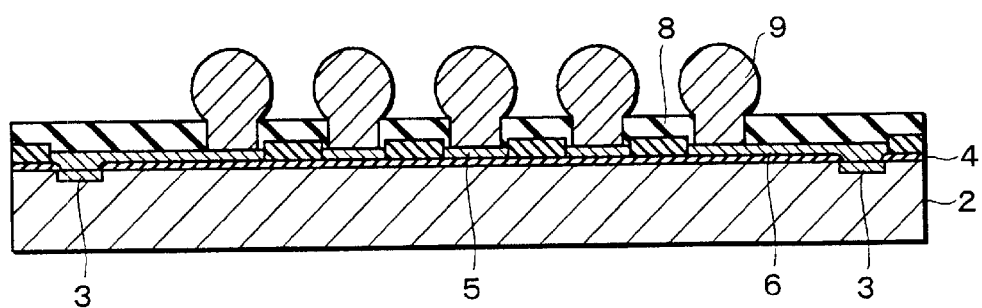

Next, referring to FIGS. 2(a), 2(b) through FIGS. 4(a) through 4(d), an explanation will be given of a manufacturing process of the semiconductor integrated circuit device 1. Here, FIG. 2(a) is a plan view that shows a state in which the wires 6 are being formed, and FIG. 2(b) is a cross-sectional view taken along line B—B of FIG. 2(a). Moreover, FIG. 3(a) is a plan view showing a further advanced state from the state of FIGS. 2(a) and 2(b), in which the wires 6 are being formed, and FIG. 3(b) is a cross-sectional view taken along line C—C of FIG. 3(a). Moreover, FIGS. 4(a) through 4(d) are cross-sectional views that show manufacturing processes after formation of the wires 6.

As illustrated in FIGS. 2(a) and 2(b), the first insulation layer 4 is formed with the first electrode pads 3 on the surface of the IC chip 2 being exposed. In conformity with the IC chip 2, the first insulation layer 4 is formed by an oxidation layer (approximately, 0.6 μm in thickness) composed of silicon dioxide ($SiO_2$), etc., an organic film (approximately, 3 μm in thickness) composed of polyimide, etc., or a stacked layer of these. On the first insulation layer 4 thus formed, the second insulation layer 7 is formed as a pattern by using an insulation material having photosensitive and heat resistant properties. The second insulation layer 7 is formed on areas except for at least one portion on the first electrode pads 3, and for formation areas of the second electrode pads 5 and the wires 6 that are formed in processes carried out later. The second insulation layer 7 is patterned by using a so-called photolithography technique; therefore, it is possible to form the second insulation layer 7 with a minimum width of several μm with respect to, for example, a base layer having a thickness of 10 μm. At this time, the second insulation layer 7 itself is allowed to serve as photoresist.

Next, as illustrated in FIGS. 3(a) and 3(b), a conductive material 10 is filled in the areas in which the second insulation layer 7 has not been formed in the processes shown in FIGS. 2(a) and 2(b). The conductive material 10, which is allowed to contact the respective first electrode pads 3 at upper portions 10a of the first electrode pads 3, is arranged to further extend to the formation positions of the second electrode pads 5 corresponding to the first electrode pads 3. In other words, the conductive material 10 is allowed to form the second electrode pad 5 and the wires 6 later.

With respect to the conductive material 10, a paste-state substance in which conductive particles are allowed to aggregate and to contain a binder and a solvent so as to provide an appropriate viscosity is used. In general, materials referred to as silver paste and copper paste are used as the conductive material 10. In this manner, the conductive material 10 is provided as paste, and filled in the areas where no second insulation layer 7 is formed by a printing method.

Here, some silver paste and copper paste contain a non-conductive binder, with the result that the wires 6 formed by the conductive material 10 tends to have a resistivity exceeding a predetermined value required. In such a case, a plating process is further applied to the upper face of each wire 6 so as to reduce the resistivity, thereby making it possible to ensure electrical paths having superior electrical properties. Moreover, metal fine particles, manufactured by a preparation method called a gaseous evaporation method, may be used, and the solvent is evaporated from the solution containing the metal fine particles by heating this, for example, at 250° C. for 15 minutes, thereby making it possible to reduce the resistivity. This method is used because the smaller the size of the particles, the greater the number of contact points between the particles per unit volume.

Referring to FIGS. 4(a) through 4(d), the following description will discuss post-manufacturing processes in the above-mentioned semiconductor integrated circuit device 1.

After the processes shown in FIGS. 3(a) and 3(b), the solvent portion of the conductive material 10 is evaporated through a heating process so that the conductive material 10 is changed from a flowing material to a hard material, thereby forming the second electrode pads 5 and the wires 6. In this case, the volume of the conductive material 10 is reduced because of the removal of the solvent portion, etc. (see FIG. 4(a)).

Next, the third insulation layer 8 is formed with an opening section being formed at least one portion on each of the second electrode pads 5 (see FIG. 4(b)). An insulating material having photosensitive and heat resistant properties is used as the third insulation layer 8, and this is patterned in the same manner as the second insulation layer 7 through a photolithography technique. In this case, the third insulation layer 8 itself is allowed to function as photoresist.

Thereafter, a conductive material 11 used for externally connecting terminals is printed or placed on the portion of the second electrodes 5 (see FIG. 4(c)). Next, the conductive material 11 is fused, and then hardened, through a heating process (approximately, at 230° for 10 seconds) so that the externally connecting terminals 9 are formed (see FIG. 4(d)).

Through the above-mentioned processes, the semiconductor integrated circuit device 1 is completed. Here, with respect to the conductive material 10 that is the material of the wires 6, those materials having a melting point higher than the conductive material 11 for the externally connecting terminals 9 are preferably used. In other words, the externally connecting terminals 9 are formed by a material having a melting point lower than that of the material of the wires 6. This arrangement is made so as to prevent the wires 6 from being again fused by the heating process used for fusing the conductive material 11 so as to form the externally connecting terminals 9.

Figure 5:
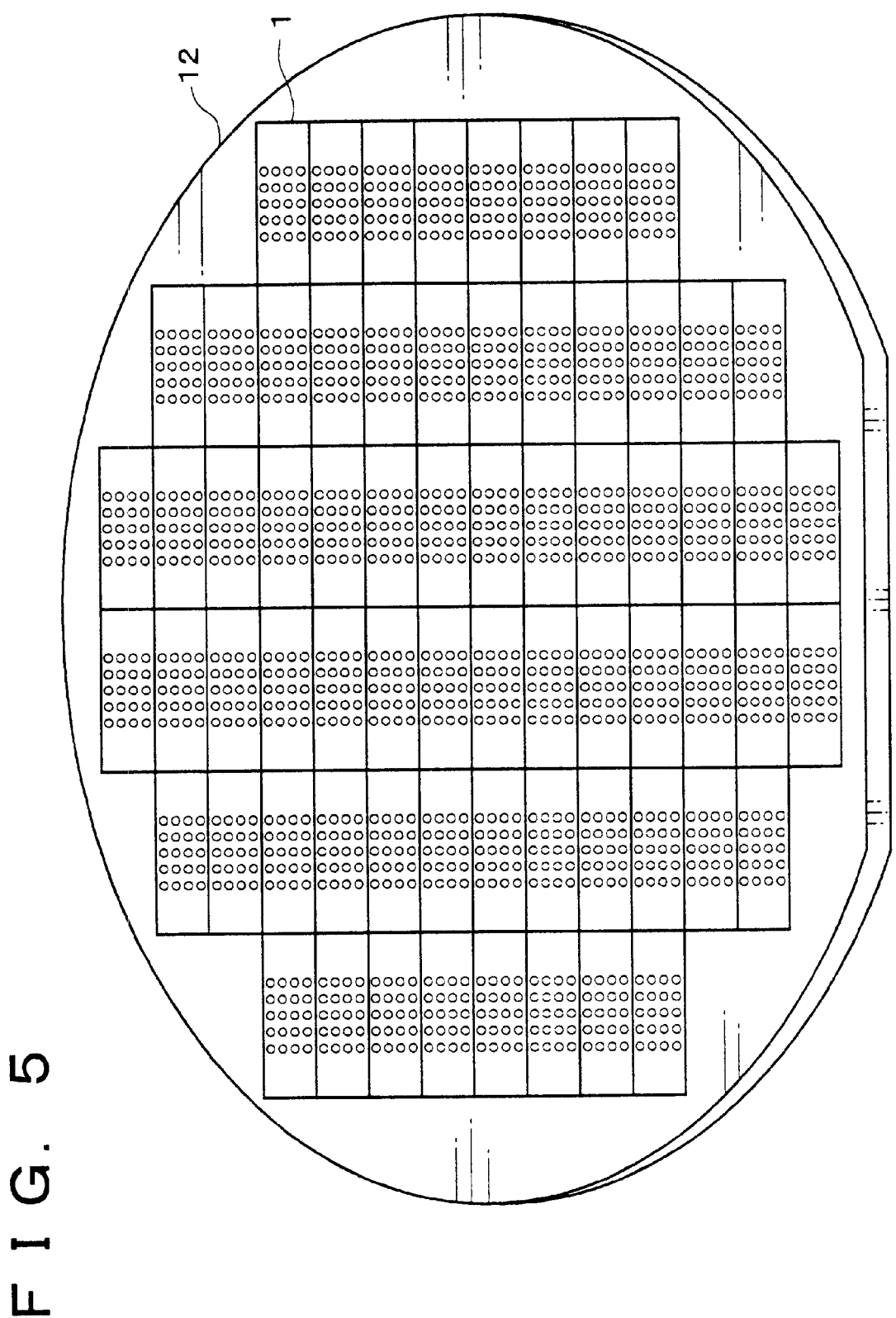
FIG. 5 is a perspective view that show a state in which the semiconductor integrated circuit devices are formed as a wafer.
Figure 6:
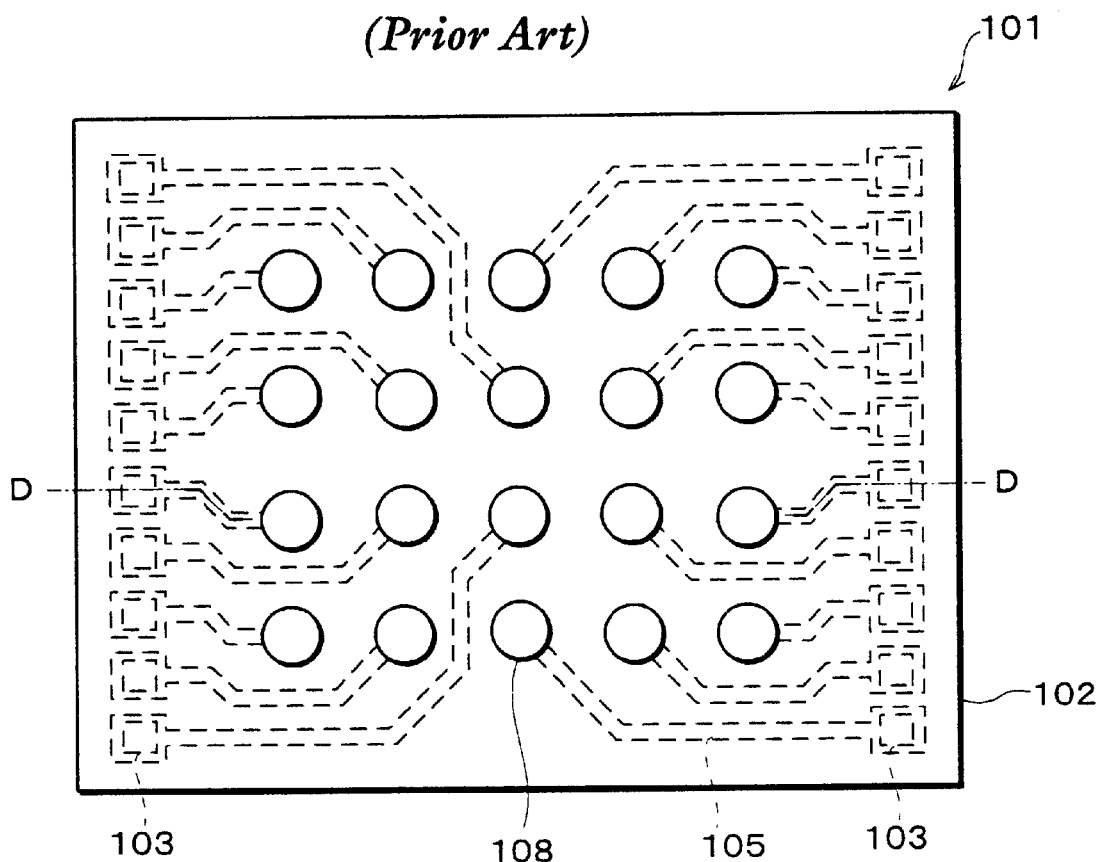
FIG. 6(a) is a plan view that shows a device structure in which a conventional semiconductor integrated circuit device is being manufactured.
FIG. 6(b) is a cross-sectional view taken along line D—D of FIG. 6(a).
Figure 6:
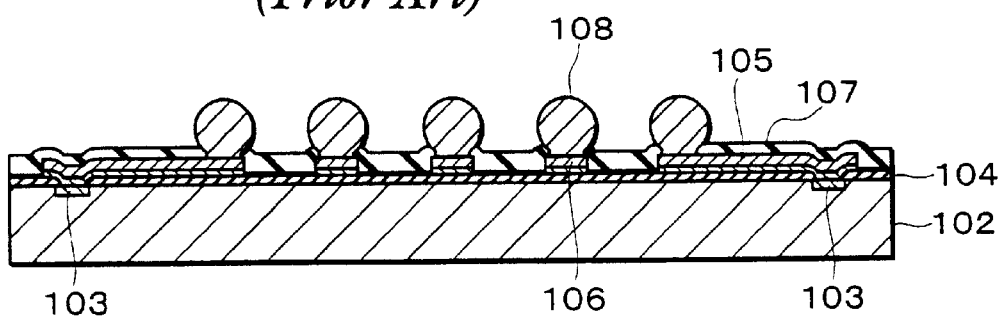
Figure 7A:
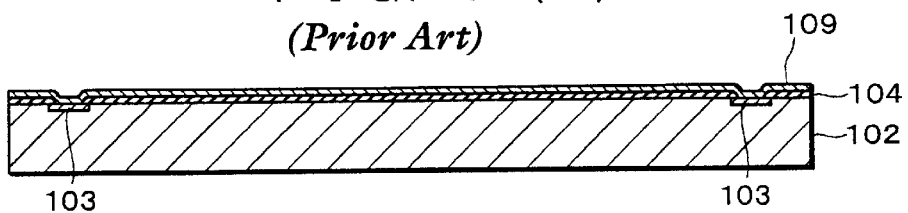
FIGS. 7(a) through 7(e) are drawings that show manufacturing processes of the conventional semiconductor integrated circuit device.
Figure 7B:
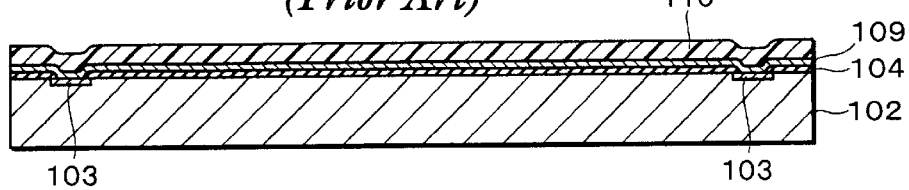
Figure 7C:
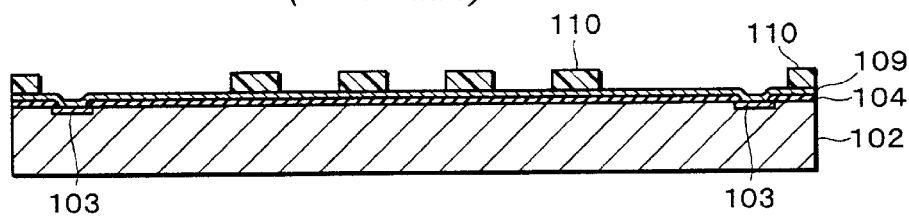
Figure 7D:
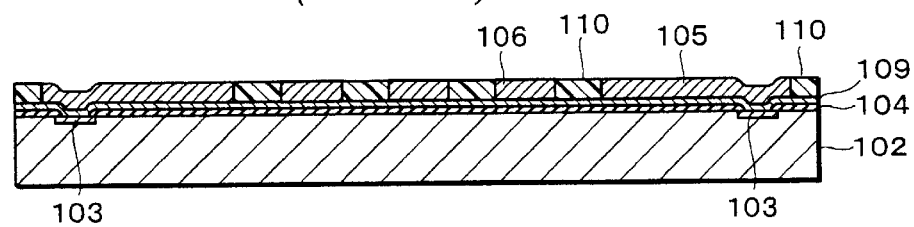
Figure 7E:
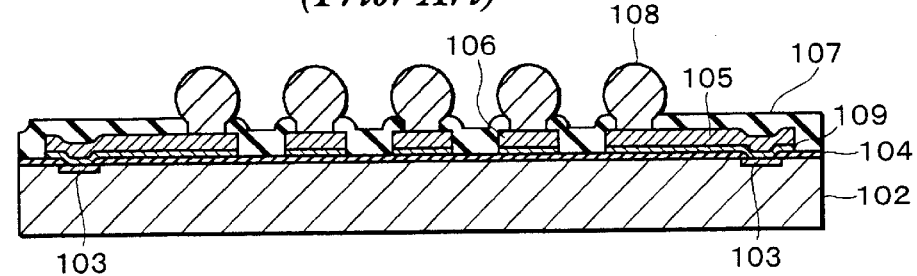

Here, up to the process as shown in FIG. 4(d), the semiconductor integrated circuit devices 1 have been assembled in a state where they are not divided into individual semiconductor integrated circuit devices, that is, where they are assembled on a wafer 12, as illustrated in FIG. 5, and this is then subjected to a dicing process so as to be divided into individual semiconductor integrated circuit devices.

As described above, in the semiconductor integrated circuit device 1 in accordance with the present embodiment, the second electrode pads 5 and the wires 6 are formed through the following four processes: (1) a process for forming an insulation film used for the second insulation layer 7; (2) a process for exposing the insulation film; (3) a process for developing the insulation film; and (4) a process for printing the conductive material 10 used for forming the second electrode pads 5 and the wires 6. Therefore, different from the semiconductor integrated circuit device in which the base layer wiring metal is formed by using the photolithography technique and the wire portion is then formed through the plating process, as shown as the conventional technique in the present specification, it is not necessary to provide many (seven) processes. Thus, it becomes possible to cut costs by reducing the number of the processes.

Moreover, in the semiconductor integrated circuit device 1 of the present embodiment, prior to forming the second electrode pads 5 and the wire 6 portion, the second insulation layer 7 is preliminarily formed on areas other than the formation areas of the second electrode pads 5 and the wires 6 as well as on areas other than the upper portions of the first electrode pads 3. The second insulation layer 7 functions as a mask at the time when the conductive material 10 (which forms the second electrode pads 5 and the wires 6) in a paste state is filled by a printing method. However, different from a mask used in a conventional printing method, the second insulation layer 7 is allowed to function as an insulating film for preventing contact between the adjacent wires 6 after completion of the device. Therefore, it is not necessary to remove it after the second insulation layer 7 has been printed. Consequently, different from the semiconductor integrated circuit device shown as the conventional technique in the specification, which is formed by using a method for simply applying conductive paste through a printing method, the arrangement of the present invention is free from a problem in which the conductive paste spreads in the horizontal direction after the mask has been removed.

Moreover, the pattern of the second insulation layer 7, which functions as a mask, is formed by using a photolithography technique that enables fine processing. Consequently, it is possible to obtain finer wires as compared with the device formed by using the conventional method.

Furthermore, the material having a photosensitive property is used as the second insulation layer 7; therefore, in the case when a pattern is formed by using a photolithography technique, the second insulation layer 7 itself is allowed to function as photoresist. This arrangement makes it possible to eliminate the necessity of placing photoresist in a separated manner, and consequently to reduce the number of the processes. Since the material of the second insulation layer 7 also has a heat resistant property, it can withstand heat at the time of the heating process of the conductive material 10 for forming the second electrode pads 5 and the wires 5 as well as at the time of the fusing process of the conductive material 11 for forming the externally connecting terminal 9.

Furthermore, the material having a photosensitive property is also used as the third insulation layer 8; therefore, in the case when a pattern is formed by using a photolithography technique, the third insulation layer 8 itself is allowed to function as photoresist. This arrangement makes it possible to eliminate the necessity of placing photoresist in a separated manner, and consequently to reduce the number of the processes. Since the material of the third insulation layer 8 also has a heat resistant property, it can withstand heat at the time of the fusing process of the conductive material 11 for forming the externally connecting terminal 9.

As described above, the semiconductor integrated circuit device of the present invention may be provided with: a semiconductor integrated circuit chip; a first electrode formed on the circuit formation face side of the semiconductor integrated circuit chip; a first insulation layer which is stacked on the circuit formation face of the semiconductor integrated circuit chip so as to allow at least one portion on the first electrode to be exposed through an opening section; a wire placed on the first insulation layer with one end being connected to the first electrode through the opening section of the first insulation layer and the other end being connected to a second electrode for external connection; and a second insulation layer which is made from a material having a photosensitive property, and placed on the first insulation layer, with an opening section for allowing at least one portion of the first electrode, the wire and at least one portion of the second electrode to be exposed, and is characterized in that the wire and the second electrode are formed by filling the opening section of the second insulation layer with particles of a conductive material.

Moreover, the semiconductor integrated circuit device in accordance with the present invention is preferably further provided with a third insulation layer having an opening section through which at least one portion of the second electrode is exposed, and is characterized in that an externally connecting terminal to be connected to the second electrode exposed through the opening section of the third insulation layer is formed into a protruding shape.

With the above-mentioned arrangement, the second electrode is exposed through the opening section formed in the third insulation layer, and the exposed portion of the second electrode forms a base portion for the externally connecting terminal. The externally connecting terminal having a protruding shape is provided on the base portion so that in the same manner as the conventional device, the semiconductor integrated circuit device of the present invention is also allowed to have the externally connecting terminal having a protruding shape that has been widely used in small-size semiconductor integrated circuit devices.

Consequently, it is possible to realize a semiconductor integrated circuit device which also has the functions of the conventional device in addition to the above-mentioned effects of the present invention.

Moreover, in the semiconductor integrated circuit device of the present invention, it is preferable to provide an arrangement in which the externally connecting terminal is composed of a material having a melting point lower than that of the material of the wire, and connected to the second electrode through a heating process.

With the above-mentioned arrangement, it is possible to avoid the possibility of the wire being again fused by heat required at the time when the externally connecting terminal is fused to be connected to the second electrode. Therefore, the arrangement of the present invention is free from a problem in which the finely formed wires are again fused to spread in the horizontal direction, causing the adjacent wires to contact each other. Thus, it becomes possible to form fine wires as a pattern that is electrically independent.

Moreover, the semiconductor integrated circuit device of the present invention may have an arrangement in which a plating process is further applied to the upper surface of each wire.

In the case when the wiring material of the present invention composed of conductive particles is prepared as a paste substance containing a binder and a solvent so as to obtain, for example, an appropriate viscosity, the non-conductive material tends to have a resistivity exceeding a predetermined value required as the wires. In such a case, a plating process is further applied to the upper face of each wire so as to reduce the resistivity, thereby making it possible to ensure electrical paths having superior electrical properties.

This arrangement makes it possible to realize a semiconductor integrated circuit device having electrical properties that are as good as those devices having conventional wires formed by plating.

Moreover, a manufacturing method of a semiconductor integrated circuit device in accordance with the present invention may comprise: a first step of forming a first insulation layer which is formed on the circuit formation face of the semiconductor integrated circuit chip with an opening section through which at least one portion on the first electrode is exposed; a second step of forming an insulation film having a photosensitive property on the first insulation layer; a third step of forming a second insulation layer which is placed on the first insulation layer, with an opening section for allowing at least one portion of the first electrode, the wire connected to the first electrode and at least one portion of the second electrode to be exposed, by exposing and developing the insulation film; and a fourth step of forming the wire and the second electrode by filling the opening section formed in the second insulation layer with particles of a conductive material.

Moreover, the manufacturing method of a semiconductor integrated circuit device in accordance with the present invention may further comprise: a fifth step in which, after the fourth step, an insulation film having a photosensitive property is further formed, and by exposing and developing the insulation film, a third insulation layer having an opening section through which at least one portion of the second electrode is exposed is formed; and a sixth step in which an externally connecting terminal having a protruding shape is formed on the second electrode portion exposed through the opening section of the third insulation layer.

In accordance with the above-mentioned method, the material having a photosensitive property is used as the third insulation layer; therefore, in the case when a pattern is formed by using a photolithography technique, the third insulation layer itself is allowed to function as photoresist. Therefore, upon patterning the third insulation layer, this arrangement makes it possible to omit the process for placing photoresist in a separated manner.

This method makes it possible to manufacture a semiconductor integrated circuit device having the externally connecting terminal with a protruding shape in the same manner as a conventional semiconductor integrated circuit device, while reducing the number of the processes to a minimum.

Moreover, in the manufacturing method of the semiconductor integrated circuit device in accordance with the present invention, it is preferable to provide an arrangement in which the externally connecting terminal is composed of a material having a melting point lower than that of the material of the wire, and connected to the second electrode through a heating process.

With the above-mentioned method, it is possible to avoid the possibility of the wire being again fused by heat required at the time when the externally connecting terminal is fused by a heating process to be connected to the second electrode. Therefore, the method of the present invention is free from a problem in which the finely formed wires are again fused to spread in the horizontal direction, causing the adjacent wires to contact each other. Thus, it becomes possible to form fine wires as a pattern that is electrically independent.

Moreover, in the manufacturing method of a semiconductor integrated circuit device in accordance with the present invention, the above-mentioned manufacturing processes are preferably carried out in a wafer state in which the semiconductor integrated circuit chips have not been divided into individual chips.

In accordance with the above-mentioned method, since the package is manufactured by forming the wires and the electrodes for external connection in the wafer state, the external dimension of the package can be basically reduced by reducing the semiconductor integrated circuit chip. This is because the manufacturing process of the package is carried out in the wafer state so that the external dimension of the package is made virtually as small as the semiconductor integrated circuit chip.

This method makes it possible to improve the productivity of the semiconductor integrated circuit device, and consequently to reduce the costs.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor integrated circuit device comprising:
    a semiconductor integrated circuit chip;
    a first electrode formed on a circuit formation face side of the semiconductor integrated circuit chip;
    a first insulation layer which is stacked on the circuit formation face of the semiconductor integrated circuit chip so as to allow at least one portion on the first electrode to be exposed through an opening section;
    a second electrode used for external connection;
    a wire placed on the first insulation layer with one end being connected to the first electrode through the opening section of the first insulation layer and the other end being connected to the second electrode; and
    a second insulation layer which is made from a material having a photosensitive property, and placed on the first insulation layer, with an opening section for allowing at least one portion of the first electrode, the wire and at least one portion of the second electrode to be exposed,
    wherein the wire and the second electrode are formed by filling the opening section of the second insulation layer with particles of a conductive material.

2. The semiconductor integrated circuit as defined in claim 1, further comprising:
    a third insulation layer having an opening section through which at least one portion of the second electrode is exposed, and an externally connecting terminal having a protruding shape, which is connected to the second electrode exposed through the opening section of the third insulation layer.

3. The semiconductor integrated circuit as defined in claim 1, wherein a plating process is further applied to a upper surface of the wire.

4. The semiconductor integrated circuit as defined in claim 1, wherein the particles of the conductive material are obtained by evaporating a solvent contained in a paste material through a heating process.

5. The semiconductor integrated circuit as defined in claim 2, wherein the externally connecting terminal is composed of a material having a melting point lower than that of the material of the wire, and connected to the second electrode through a heating process.

6. The semiconductor integrated circuit as defined in claim 2, wherein the third insulation layer is formed by an insulating material having a photosensitive property.

* * * * *